US009823319B2

(12) United States Patent
Yoo

(10) Patent No.: US 9,823,319 B2
(45) Date of Patent: Nov. 21, 2017

(54) RADIO FREQUENCY RESONATOR AND MAGNETIC RESONANCE IMAGING APPARATUS COMPRISING THE SAME

(71) Applicant: Hyoung Suk Yoo, Ulsan (KR)

(72) Inventor: Hyoung Suk Yoo, Ulsan (KR)

(73) Assignee: UNIVERSITY OF ULSAN FOUNDATION FOR INDUSTRY COOPERATION, Nam-gu, Ulsan (KR)

( * ) Notice: Subject to any disclaimer, the term of this patent is extended or adjusted under 35 U.S.C. 154(b) by 646 days.

(21) Appl. No.: 14/266,602

(22) Filed: Apr. 30, 2014

(65) Prior Publication Data

US 2015/0260806 A1   Sep. 17, 2015

(30) Foreign Application Priority Data

Mar. 11, 2014  (KR) .................... 10-2014-0028565

(51) Int. Cl.
*G01V 3/00*       (2006.01)
*G01R 33/3415*    (2006.01)
*G01R 33/34*      (2006.01)
*G01R 33/345*     (2006.01)

(52) U.S. Cl.
CPC ... *G01R 33/3415* (2013.01); *G01R 33/34007* (2013.01); *G01R 33/3456* (2013.01)

(58) Field of Classification Search
CPC .......... G01R 33/3415; G01R 33/34007; G01R 33/3456
USPC ....................................................... 324/309
See application file for complete search history.

(56) References Cited

U.S. PATENT DOCUMENTS

| 4,853,660 | A  | * | 8/1989 | Schloemann | ............. | H01P 1/11 333/204 |
| 4,920,318 | A  | * | 4/1990 | Misic | ............... | G01R 33/34046 324/318 |
| 7,023,209 | B2 | * | 4/2006 | Zhang | .................. | G01R 33/345 324/318 |
| 7,420,371 | B2 | * | 9/2008 | Zhang | .............. | G01R 33/34007 324/318 |
| 2002/0079996 | A1 | * | 6/2002 | Zhang | .................. | G01R 33/345 335/216 |

OTHER PUBLICATIONS

Zhang et al., Microstrip RF Surface Coil Design for Extremely High-Field MRI and Spectrocopy, 2001, Magnetic Resonance in Medicine.*

* cited by examiner

*Primary Examiner* — Susan Lee
(74) *Attorney, Agent, or Firm* — Porzio Bromberg & Newman P.C.

(57) ABSTRACT

The present disclosure relates to a radio frequency resonator and a magnetic resonance imaging apparatus comprising the same. A radio frequency resonator for a magnetic resonance imaging apparatus in accordance with the present disclosure comprises: a microstrip substrate; a conductive pattern portion for resonance that is formed on one surface of the microstrip substrate and increases an intensity of a magnetic field which is generated by resonating an RF signal; and a ground conductive board that is formed on the other surface of the microstrip substrate. According to the present disclosure, there is provided a radio frequency resonator for a magnetic resonance imaging apparatus capable of generating an intense magnetic field.

6 Claims, 7 Drawing Sheets

(a)

(b)

(c)

(d)

RADIO FREQUENCY RESONATOR AND MAGNETIC RESONANCE IMAGING APPARATUS COMPRISING THE SAME

CROSS-REFERENCE TO RELATED APPLICATIONS

This application claims the benefit under 35 U.S.C. §119(a) of Korean Patent Application No. 10-2014-0028565, filed on Mar. 11, 2014, in the Korean Intellectual Property Office, the entire disclosure of which is incorporated herein by reference for all purposes.

BACKGROUND

1. Field

The present disclosure relates to a radio frequency resonator and a magnetic resonance imaging apparatus comprising the same. More particularly, it concerns a radio frequency resonator for a magnetic resonance imaging apparatus capable of effectively increasing an intensity of a magnetic field that is generated by resonating an RF signal and a magnetic resonance imaging apparatus comprising the same.

2. Description of the Related Art

An MRI (magnetic resonance image) method is up-to-date nondestructive, non-radioactive inspection method that is not only effective but comfortable to human body. Currently, it is commonly used in diagnosis of brain, spinal disorder, bone, joint disease, cardiovascular, chest disease, congenital heart disease, myocardial infarction and so forth. The MRI uses such a principle by which when applying a static magnetic field to human body, hydrogen atom nucleus included in cell component molecule has a resonance frequency proportional to the intensity of magnetic field, and thereby electromagnetic waves of the frequency is well absorbed or released.

The MRI apparatus is an apparatus that inspects the inside of human body using such principle. Under a circumstance in which an intense static magnetic field is applied to the portion to be measured, such the MRI apparatus is configured to irradiate a wave corresponding to the resonance frequency to human body in the pulse form and to thereby excite the hydrogen atom nucleus into a high energy state. While the excited hydrogen atom nucleus is returned in a low energy state again, most of the energy held therein is released to outside in the form of magnetic field. The magnetic field released as above is an MR (magnetic resonance) signal.

While the hydrogen atom nucleus releases a magnetic field, when additionally applying a magnetic field having intensity different in accordance with a position, such as a gradient field whose intensity increases in proportional to a distance in one direction from a reference point, the frequency of the magnetic field which is released from the hydrogen atom nucleus at each position has a deviation that is proportional to a position toward a center frequency which is determined by a static magnetic field.

When the MR signal is signal-processed by receiving by means of detector or by receiving antenna, it is therefore possible to obtain am image that shows a density distribution of the hydrogen atom nucleus.

Meanwhile, a Magnetic Resonance Imaging system having a high magnetic field of 7 T (Tesla) or more has an excellent signal-to-noise ratio and resolution, and many researches are now conducted for use as an important tool for clinical diagnosis and analysis in modern medical science. However, in the Magnetic Resonance Imaging system having high magnetic field, it is difficult to obtain an image for clinical diagnosis and analysis because of uniformity of a magnetic field ($B1^+$) that is generated in an RF resonator. Although researches are carried out as well as to a method for overcoming the uniformity problem of magnetic field by use of a multi-channel coil, a satisfactory outcome is not acquired. Specifically, there is no known the RF resonator applicable to a clinical 3 T magnetic resonance imaging system.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

The technical objective of the present disclosure is to provide a radio frequency resonator for a magnetic resonance imaging apparatus capable of generating an intense magnetic field.

Further technical objective of the present disclosure is to provide a magnetic resonance imaging apparatus capable of generating a high performance radio frequency coil and a high quality image by use of a radio frequency resonator.

To achieve the above technical objectives, according to the present disclosure, a radio frequency resonator for a magnetic resonance imaging apparatus comprises a microstrip substrate; a conductive pattern portion for resonance that is formed on one surface of the microstrip substrate and increases an intensity of a magnetic field which is generated by resonating an RF signal; and a ground conductive board that is formed on the other surface of the microstrip substrate.

The conductive pattern portion for resonance has a single meander line structure in which one meander line is formed.

In cases where a width of the meander line is 3 mm, a length of the meander line is 129 mm.

The conductive pattern portion for resonance has a double meander line structure in which two meander lines are formed.

In cases where a width of the meander line is 1 mm, a length of the meander line is 12 mm.

The conductive pattern portion for resonance has a four (4) arms SIR(Stepped Impedance Resonator) structure.

The conductive pattern portion for resonance having the four (4) arms SIR structure consists of: two first line portions that are formed to be extended from both ends; a second line portion that is formed between the two first line portions and has a width narrower than a width of the first line portion; and a third line portion having a four (4) arms shape pattern which is formed to be extended from the first line portion in parallel with the second line portion.

A length of the two first line portions is respectively 40 mm.

In cases where a width of the second line portion is 7 mm, a length of the second line portion is 70 mm.

A width of four (4) arms shape pattern that constitutes the third line portion is 2 mm, and a length is 20 mm.

The conductive pattern portion for resonance has a three stage SIR structure.

The conductive pattern portion for resonance having the three stage SIR structure consists of: two fourth line portions that are formed to be extended from both ends; and a fifth line portion that is formed between the two fourth line portions and has a width narrower than a width of the fourth line portion.

In cases where a width of the fifth line portion is 2.6 mm, a length of the fifth line portion is 110 mm.

A length of the fourth line portion is 20 mm.

A thickness of the conductive pattern portion for resonance is 20 mm, and a length is 150 mm, and a width is 18 mm.

In cases where a width of the conductive pattern portion for resonance is 18 mm, a length of the conductive pattern portion for resonance is 150 mm.

According to the present disclosure, there is provided a radio frequency resonator for a magnetic resonance imaging apparatus capable of generating an intense magnetic field.

Also provided is a magnetic resonance imaging apparatus capable of generating a high performance radio frequency coil and a high quality image by use of a radio frequency resonance in accordance with the present disclosure.

DETAILED DESCRIPTION

Hereinafter, a basic principle applied to the present disclosure will be explained before explaining the preferred embodiments of the present disclosure.

Though explained briefly earlier, in the Magnetic Resonance Imaging system having high magnetic field of 7 T or more, it is difficult to obtain am image for clinical diagnosis and analysis because of uniformity of a magnetic field that is generated in an RF resonator. Although researches are carried out as well as to a method for overcoming the uniformity problem of magnetic field by use of a multi-channel coil, a satisfactory outcome is not discovered. Specifically, there is no known the RF resonator applicable to a clinical 3 T magnetic resonance imaging system.

An RF resonator using a microstrip is used as an element of multi-channel coil for a human body head coil and body coil. By independently controlling a current magnitude and phase of the RF resonator respectively, an RF shimming may be effectively applied so as to alleviate the uniformity of magnetic field. But, such magnetic resonance imaging apparatus system of high resolution is not applied to an actual clinic.

Therefore, in the present disclosure, there are suggested various RF resonators that use a microstrip capable of using multi-channel RF coil used in a high resolution, in 3 T clinical magnetic resonance imaging system.

An RF magnetic field intensity that is permeated to a spherical phantom is compared with each other. A performance thereof is appreciated by confirming whether appropriate as an element of multi-channel coil for a parallel imaging through the magnetic field distribution.

Figure 1:
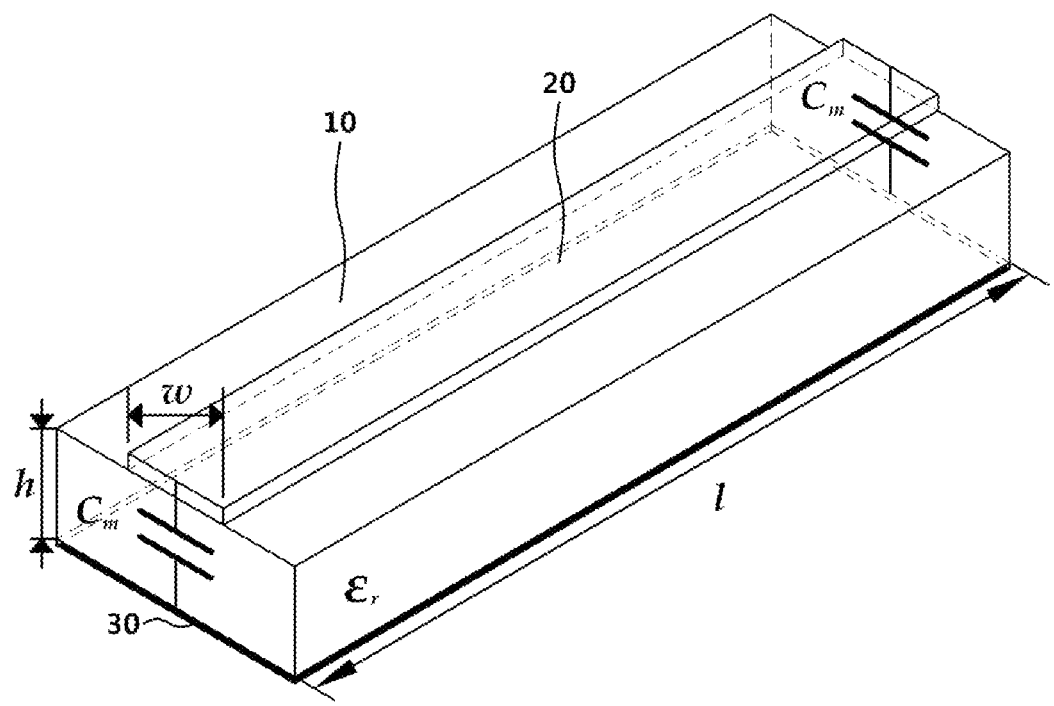
FIG. 1 is a view conceptually illustrating a microstrip transmission line which is applied to the embodiments of the present disclosure.

FIG. 1 is a view illustrating a microstrip transmission line which is applied to the embodiments of the present disclosure.

Referring to FIG. 1, a dielectric uses teflon ($\in_r$=2.08, loss tan=0.004). A height and length of the dielectric are respectively 20 mm, 150 mm. A width of the microstrip is 18 mm. A resonator using a general microstrip uses a resonance of $\lambda/2$. Two parallel capacitors are connected to feed and final end portions. Such the parallel capacitor is used to reduce an electric length of RF resonator and is also used for adjustment in regards to Larmor frequency (128 MHz, 3 T).

One of main objectives of the present disclosure is to increase an intensity of RF magnetic field that is permeated to a dielectric substance (human body). In the magnetic resonance imaging system, an image resolution differs in accordance with an intensity (B1$^+$) of magnetic field and the intensity of magnetic field may be shown as below mathematical formula 1.

$$B_1^+ = \frac{(B_x + jB_y)}{2} \qquad \text{Mathematical formula 1}$$

In the mathematical formula 1, j=$\sqrt{-1}$; Bx and By represent complex vector in a direction of x and y of RF magnetic field. In order to increase the permeated RF magnetic field, an RF magnetic field intensity is compared in a manner to realize various structures to a line of microstrip like FIG. 2. It is designed that an intensity of dielectric of RF resonator and a line width of microstrip in accordance win the four embodiments of the present disclosure are identical and for adjustment, a capacitor is connected in parallel to feed and final end portions.

Figure 2:
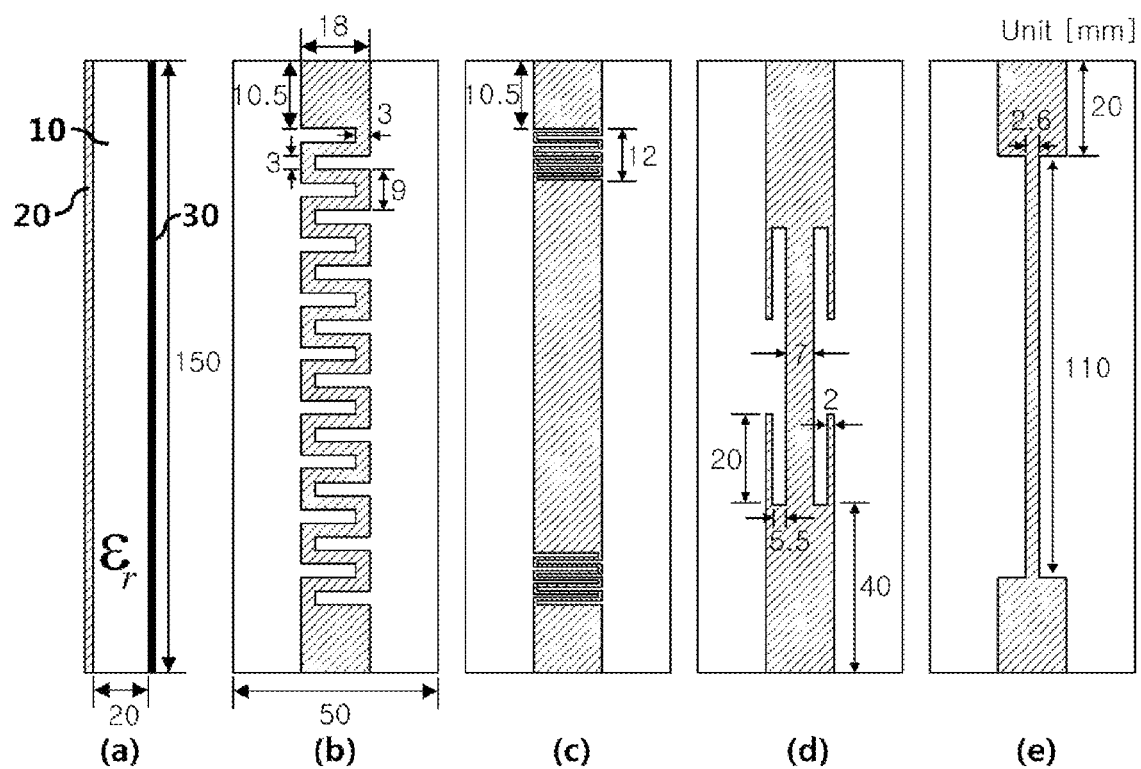
FIG. 2 is a view illustrating a side view and a plan view of a radio frequency resonator for a magnetic resonance imaging apparatus in accordance with the embodiments of the present disclosure.

FIG. 2 is a view illustrating a side view and a plan view of a radio frequency resonator for a magnetic resonance imaging apparatus in accordance with the embodiments of the present disclosure.

(a) of FIG. 2 is a side view of a radio frequency resonator in accordance with one embodiment of the present disclosure.

Referring to FIG. 1 and (a) of FIG. 2, the radio frequency resonator according to one embodiment of the present disclosure is formed in a microstrip substrate 10 and at one surface of the microstrip substrate 10; and comprises a conductive pattern portion for resonance 20 that increases an intensity of magnetic field which is generated by resonating an RF signal and a ground conductive board 30 that is formed on the other surface of microstrip substrate 10. For example, a thickness of the microstrip substrate 10 may be 20 mm; a length may be 150 mm. A thickness of the conductive pattern portion for resonance 20 may be 20 mm; a length may be 150 mm; and a width may be 18 mm.

(b) of FIG. 2 is a case where a conductive pattern portion for resonance has a single meander line structure. (c) of FIG. 2 is a case where a conductive pattern portion for resonance has a double meander line structure. (d) of FIG. 2 is a case where a conductive pattern portion for resonance has a four (4) arms SIR (Stepped Impedance Resonator) structure. (e) of FIG. 2 is a case where a conductive pattern portion for resonance has a three stage SIR structure.

Hereinafter, each pattern will be explained by separate embodiments.

Figure 3:
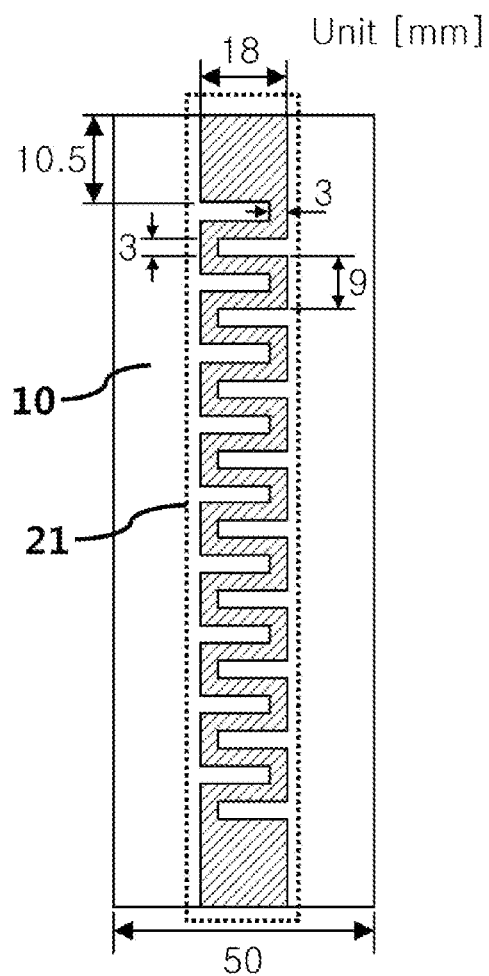
FIG. 3 is a view illustrating a radio frequency resonator in accordance with the first embodiment of the present disclosure.

FIG. 3 is a view illustrating a radio frequency resonator in accordance with the first embodiment of the present disclosure, and is a case where a conductive pattern portion for resonance 21 has a single meander line structure.

Referring additionally to FIG. 3, the conductive pattern portion for resonance 21 that constitutes a radio frequency resonator according to the first embodiment, has a single meander line structure.

The single meander line structure is a structure where one meander line is formed between the feed region and final end region. The meander line is a structure by which a winding shape is provided so as to extend a signal line length as disclosed in FIG. 3. For example, in cases where a width of meander line is 3 mm, a length of the meander line may be designed in 129 mm, and the meander line may be formed at a 10.5 mm isolated point from the end of conductive pattern portion for resonance.

Figure 4:
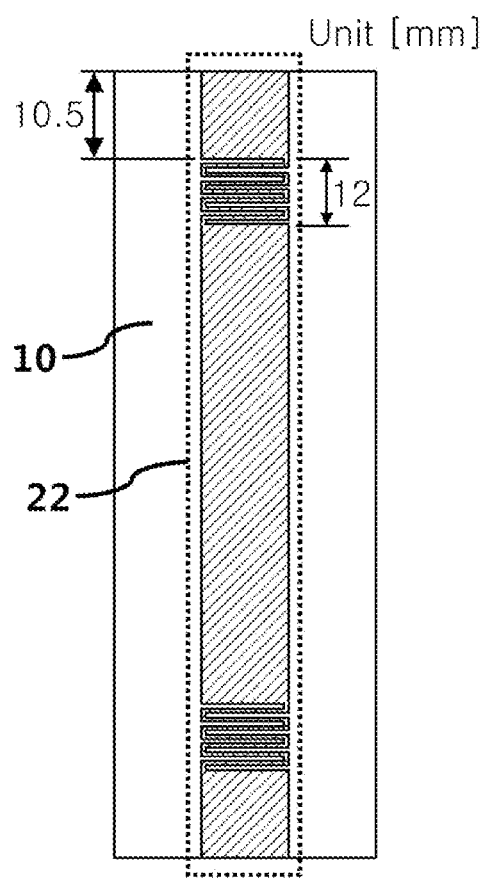
FIG. 4 is a view illustrating a radio frequency resonator in accordance with the second embodiment of the present disclosure.

FIG. 4 is a view illustrating a radio frequency resonator in accordance with the second embodiment of the present disclosure, and is a case where a conductive pattern portion for resonance 22 has a double meander line structure.

Referring additionally to FIG. 4, the conductive pattern portion for resonance 22 that constitutes a radio frequency resonator in accordance with the second embodiment has a double meander line structure.

The double meander line structure is a structure in which two meander lines are formed which have an identical shape around the both ends of the conductive pattern portion for resonance 22, i.e., around the feed region and final end region. A meander line in the second embodiment has a structure whose width and length are demagnified when compared to the first embodiment. For example, in cases where a width of the meander line is 1 mm, a length of the meander line may be designed in 12 mm. Two meander lines may be formed at a 10.5 mm isolated point from the end of conductive pattern portion for resonance respectively.

Figure 5:
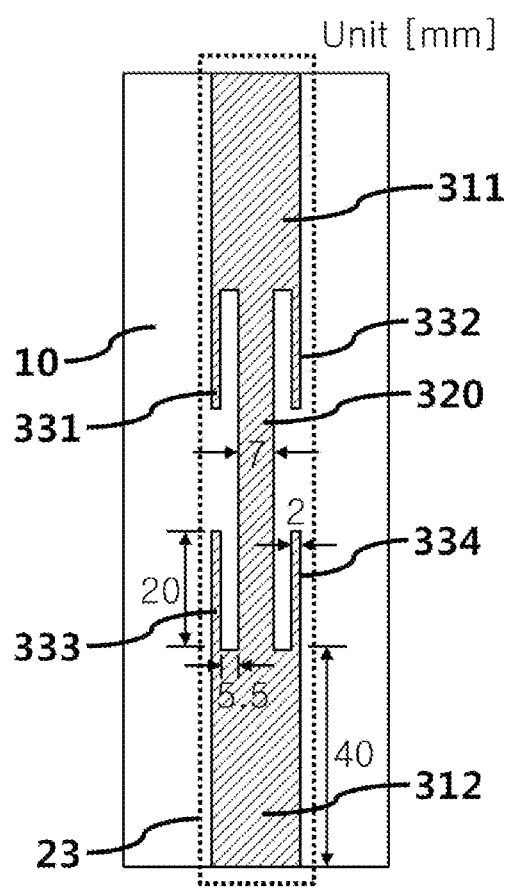
FIG. 5 is a view illustrating a radio frequency resonator in accordance with the third embodiment of the present disclosure.

FIG. 5 is a view illustrating a radio frequency resonator in accordance with the third embodiment of the present disclosure and is a case where a conductive pattern portion for resonance 23 has four (4) arms SIR(Stepped Impedance Resonator) structure.

Referring additionally to FIG. 5, the conductive pattern portion for resonance 23 that constitutes a radio frequency resonator in accordance with the third embodiment has a four (4) arms SIR structure.

The 4 arms SIR structure is such a structure having a relatively wide width line and a narrow line positioned between the wide line and an arm shaped line that is extended from the wide line.

For example, a conductive pattern portion for resonance 23 having four (4) arms SIR structure may consist of a first line portion 311, 312; a second line portion 320; and a third line portion 331, 332, 333, 334.

The first line portions 311, 312 are two lines that are formed to be extended from both ends of the conductive pattern portion for resonance, and has a relatively wider width than second line portion 320 and third line portions 331, 332, 333, 334.

The second line portion 320 is formed between the two first line portions 311, 312 and has a relative narrower width than the first line portions 311, 312.

The third line portion 331, 332, 333, 334 has a 4 arms shape pattern formed to be extended from the first line portion 311, 312 in a direction parallel to the second line portion 320. The third line portion 331, 332, 333, 334 has a width and length which are relatively smaller than first line portion 311, 312 and second line portion 320.

For example, a length of two first line portions 311, 312 may be respectively 40 mm, a width of the second line portion 320 may be 7 mm, a length of the second line portion 320 may be 70 mm, a width of 4 arms shape pattern that constitutes the third line portions 331, 332, 333, 334 may be 2 mm, and a length thereof may be 20 mm. Further, an interval between the second line portion 320 and the third line portion 331, 332, 333, 334 may be 5.5 mm.

Figure 6:
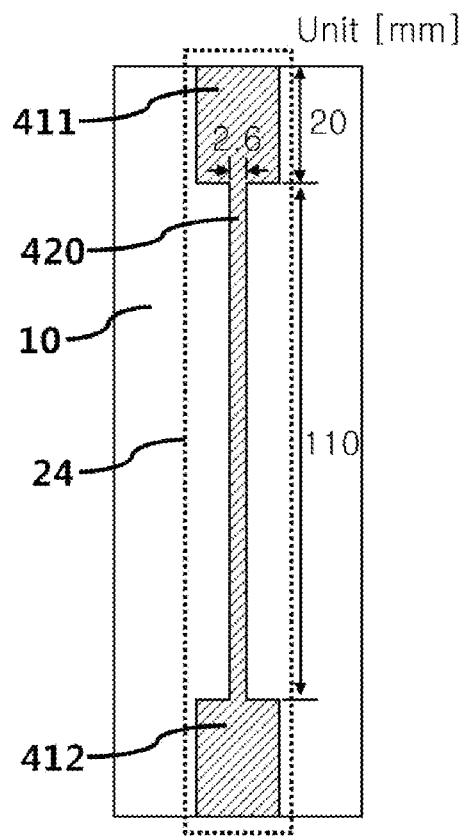
FIG. 6 is a view illustrating a radio frequency resonator in accordance with the fourth embodiment of the present disclosure.

FIG. 6 is a view illustrating a radio frequency resonator in accordance with the fourth embodiment of the present disclosure, and is a case where a conductive pattern portion for resonance 24 has a three stage SIR structure.

Referring additionally to FIG. 6, the conductive pattern portion for resonance 24 that constitutes a radio frequency resonator in accordance with the fourth embodiment of the present disclosure has a three stage SIR structure.

The three stage SIR structure is a structure having a relatively wide width line and a narrow line positioned between the wide line.

For example, the conductive pattern portion for resonance 24 which has the three stage SIR structures may consist of a fourth line portion 411, 412 and a fifth line portion 420.

The fourth line portions 411, 412 are two lines that are formed to be extended from both ends of the conductive pattern portion for resonance 24, and has a relatively wider width than the fifth line portion 420.

The fifth line portion 420 is formed between two fourth line portions 411, 412, and has a relatively narrower width than the fourth line portion 411, 412.

For example, in cases where a width of the fifth line portion 420 is 2.6 mm, a length of the fifth line portion 420 may be 110 mm and a length of the fourth line portion 411, 412 may be 20 mm.

Hereinafter described is experimental result in which the embodiments of the present disclosure are applied.

Figure 7:
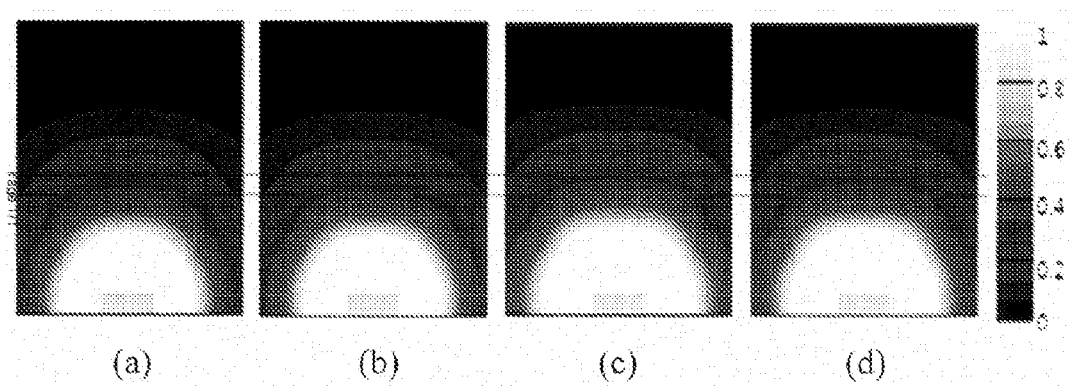
FIG. 7 is a photograph in which an RF magnetic field distribution is measured which is permeated in accordance with the embodiments of the present disclosure.

FIG. 7 is a photograph in which an RF magnetic field distribution is measured which is permeated in accordance with the embodiments of the present disclosure.

Referring to FIG. 7, based on a finite difference time-domain method, a SEMCAD is used to measure an intensity of magnetic field in a spherical phantom. The spherical phantom is for similarly modelling a human body head and is characterized by $\in_r=58.1$, $\sigma=0.539$ (S/m), radius=100 mm.

Four RF resonators according to the embodiments provided herein show a frequency response excellent at Larmor frequency (128 MHz, 3 Tesla). It is identified that the frequency response is maximally −20 dB approximately. As disclosed in FIG. 7, in an identical input voltage, in cases where a radio frequency resonator according to the third embodiment (i.e., a conductive pattern portion for resonance 23) has a 4 arms SIR structure, it is identified that a permeation distribution of high frequency magnetic field is relatively higher than other embodiments. The following table 1 represents an RF magnetic field intensity in accordance with a permeation depth.

TABLE 1

| Position<br>Resonator | 22 mm | 40 mm | 67 mm | 86 mm | 105 mm |
|---|---|---|---|---|---|
| First Embodiment<br>(Meander line) | 3.492 | 1.523 | 0.611 | 0.382 | 0.260 |
| Second Embodiment<br>(Resonator with two<br>meander lines) | 3.425 | 1.454 | 0.574 | 0.358 | 0.243 |
| Third Embodiment<br>(SIR with four arms) | 5.069 | 1.991 | 0.755 | 0.465 | 0.314 |
| Fourth Embodiment<br>(SIR) | 4.813 | 1.880 | 0.715 | 0.440 | 0.298 |

Referring to TABLE 1, in a center of phantom (105 mm), intensities of permeated RF magnetic field of four RF resonators are respectively 0.260, 0.243, 0.314, 0.298 (A/m). RF resonator in accordance with the third embodiment has a biggest intensity of permeated RF magnetic field relatively, compared to other embodiments. Input electricity of four RF resonators is normalized as 1 watt.

Figure 8:
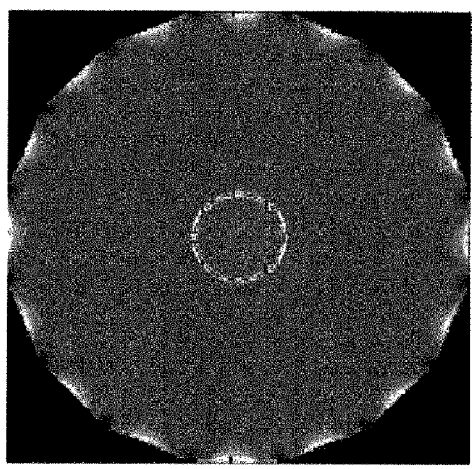
FIG. 8 is a photograph in which a magnetic field map is measured which is generated by a 16 channels coil in which the embodiments of the present disclosure are applied.
Figure 8:
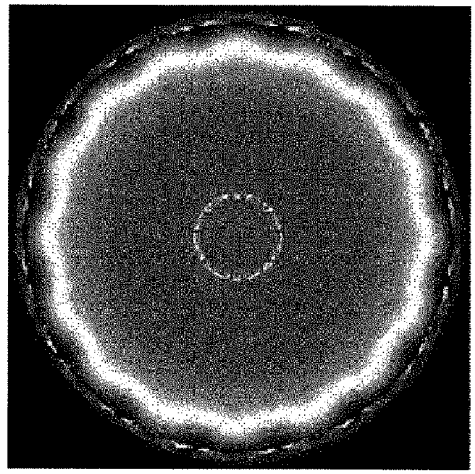
Figure 8:
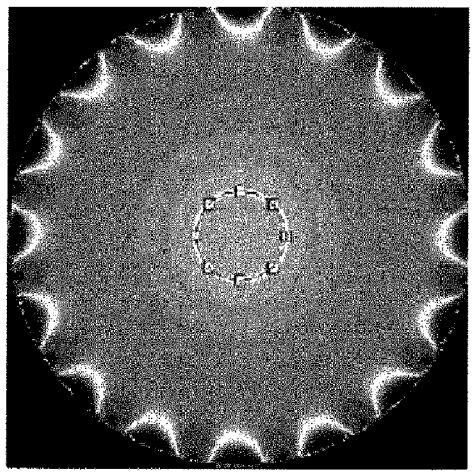
Figure 8:
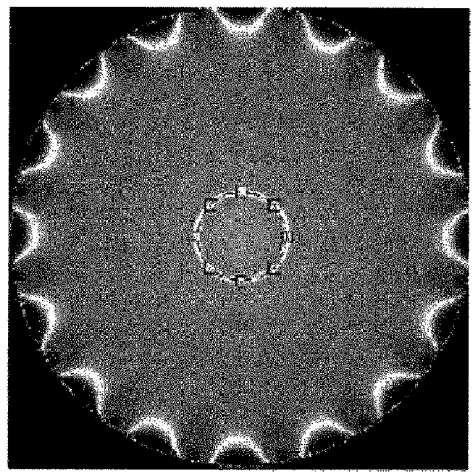

FIG. 8 is a photograph in which a magnetic field map is measured which is generated by a 16 channels coil in which the embodiments of the present disclosure are applied.

By means of rotating respective RF resonators at phase angle of 22.5, and using a superposition principle, a magnetic field intensity map of 16 channels phased RF resonator is thus calculated in a phantom. The following table 2 discloses SUM, AVG. and STD. of a peak value of magnetic field intensity regarding 16 channels coil.

TABLE 2

| Values<br>Resonator | SUM | AVG. | STD. |
|---|---|---|---|
| First Embodiment<br>(Meander line) | 40.222 | 0.0976 | 0.5487 |
| Second Embodiment<br>(Resonator with two<br>meander lines) | 39.192 | 0.0951 | 0.6143 |
| Third Embodiment<br>(SIR with four arms) | 50.747 | 0.1231 | 0.6923 |
| Fourth Embodiment<br>(SIR) | 48.354 | 0.1173 | 0.6596 |

Referring to TABLE 2, in an interest region being phantom centered, it may be understood that a 16 channels coil that uses an RF resonator applied with a conductive pattern portion for resonance 24 having 4 arms SIR structure in accordance with the third embodiment, provides a more uniform magnetic field intensity distribution, compared to other 16 channels coils. Generally, an improved coil has a magnetic field that is higher and more uniform in an object, and consequently has a lower standard deviation and higher average value.

As described above in detail, according to the present disclosure, there is provided a radio frequency resonator for a magnetic resonance imaging apparatus capable of generating an intense magnetic field.

Also provided herein is a magnetic resonance imaging apparatus capable of generating a high performance radio frequency coil and a high quality image by use of a radio frequency resonator in accordance with the present disclosure.

A 3 T magnetic resonance image system becomes a standard technology in the arts to obtain the human body image and diagnose. However, compared to a magnetic resonance image system of high magnetic field of 7 T or more, a signal-to-noise ratio of 3 T magnetic resonance image system is poor. To solve the above problem, the present disclosure proposes four structures of RF resonator, and confirms that in cases of a step impedance resonator having four arms, an RF magnetic field which is permeated in a center of spherical phantom is the biggest. Based on this, a 16 channels head coil is constructed.

This disclosure has been described above in the preferred embodiments, but is not limited to those. It is known to persons skilled in the art that some modifications and innovations may be made without departing from the spirit and scope of this disclosure. Hence, the scope of this disclosure should be defined by the following claims.

What is claimed is:

1. A radio frequency resonator for a magnetic resonance imaging apparatus, the resonator comprising:
    a microstrip substrate,
    a conductive pattern portion for resonance that is formed on one surface of the microstrip substrate and increases an intensity of a magnetic field which is generated by resonating an RF signal; and
    a ground conductive board that is formed on the other surface of the microstrip substrate,
    wherein the conductive pattern portion for resonance has a four (4) arms SIR (Stepped Impedance Resonator) structure.

2. The radio frequency resonator for magnetic resonance imaging apparatus of claim 1, wherein the conductive pattern portion for resonance having the four (4) arms SIR structure consists of:
    two first line portions that are formed to be extended from both ends;
    a second line portion that is formed between the two first line portions and has a width narrower than a width of the first line portion; and
    a third line portion having a four (4) arms shape pattern which is formed to be extended from the first line portion in parallel with the second line portion.

3. The radio frequency resonator for magnetic resonance imaging apparatus of claim 2, wherein a length of the two first line portions is respectively 40 mm.

4. The radio frequency resonator for magnetic resonance imaging apparatus of claim 3, wherein in cases where a width of the second line portion is 7 mm, a length of the second line portion is 70 mm.

5. The radio frequency resonator for magnetic resonance imaging apparatus of claim 4, wherein a width of four (4) arms shape pattern that constitutes the third line portion is 2 mm, and a length is 20 mm.

6. A magnetic resonance imaging apparatus comprising the radio frequency resonator for magnetic resonance imaging apparatus described in claim 1.

* * * * *